Sept. 24, 1963 O. HELLER 3,105,199
TRANSISTORIZED AMPLIFIER
Filed June 5, 1959
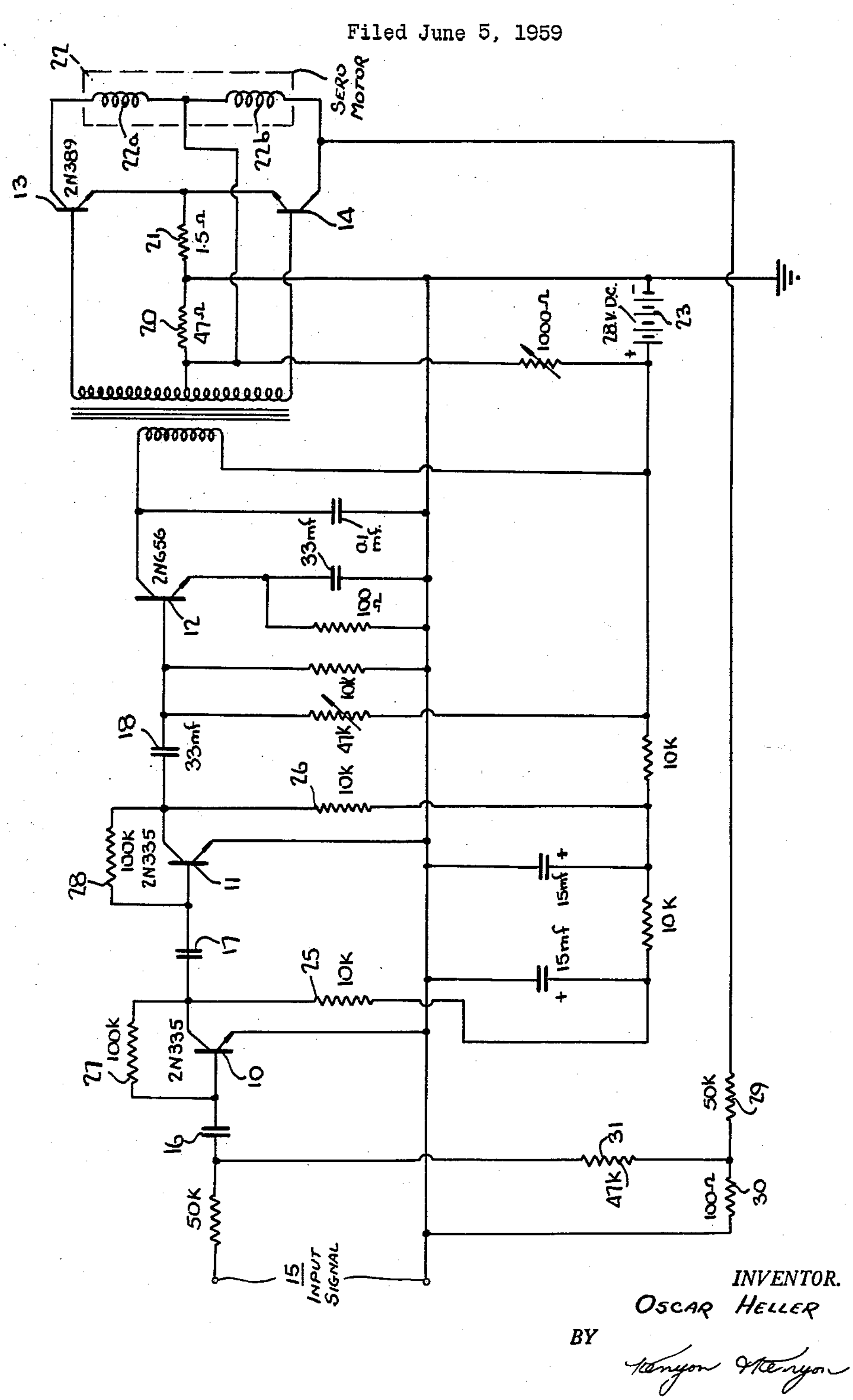
INVENTOR.
OSCAR HELLER
BY
Kenyon & Kenyon
ATTORNEYS

United States Patent Office 3,105,199
Patented Sept. 24, 1963

3,105,199
TRANSISTORIZED AMPLIFIER

Oscar Heller, New York, N.Y., assignor to Bulova Research and Development Laboratories, Inc., Woodside, N.Y., a corporation of New York Filed June 5, 1959, Ser. No. 818,397
3 Claims. (Cl. 330—15)

This invention relates generally to electronic amplifiers and more particularly to an improved transistorized amplifier adapted to operate efficiently under adverse environmental conditions.

The expanding applications for electronic equipment are such that amplifiers must now be incorporated into devices which are subjected to a wide range of temperature variation and which undergo a high order of shock acceleration and vibration. Such conditions are met, for example, in the electronic control systems for guided missiles and in high altitude aircraft installations.

Thus, in an aircraft altimeter of the type disclosed in the copending Fischer application, Serial No. 807,782, filed April 21, 1959, now Patent No. 3,068,699, there is entailed an amplifier for controlling a servo motor. Such altimeters must work reliably within a temperature range of −55° to +125° C., to meet stringent aircraft requirements. The amplifier must also be able to withstand the mechanical forces encountered in aircraft operation.

Accordingly, it is the principal object of this invention to provide an amplifier which operates efficiently and reliably even under adverse environment conditions.

Also an object of the invention is to provide an amplifier of extremely compact and light weight design and which affords maximum power and weight per unit volume.

Yet another object of the invention is to provide a transistorized amplifier of high input impedance, high voltage gain and high power gain, the performance of the circuit being maintained under difficult environmental conditions.

A further object of the invention is to provide an amplifier which is so controlled as to afford maximum A.C. and D.C. stability in the temperature range of operation.

For a better understanding of the invention as well as other objects and further features thereof, reference is had to the following detailed description to be read in conjunction with the accompanying drawing whose single FIGURE schematically illustrates a preferred embodiment of the amplifier circuit.

Referring now to the drawing, the amplifier, in accordance with the invention, comprises a first pre-amplifier stage including a transistor 10, a second pre-amplifier stage including a transistor 11, a driver stage including a transistor 12, and a push-pull output stage including a pair of transistors 13 and 14. In practice, the transistors may all be standard silicon devices, transistors 10 and 11 being of the 2N335 type, transistor 12 of the 2N656 type and transistors 13 and 14 of the 2N389 type.

An input signal introduced at terminals 15 is applied between the base and emitter of transistor 10 through capacitor 16. The output of the first pre-amplifier stage is taken from the collector electrode of transistor 10 and is applied through capacitor 17 to the base of transistor 11 relative to the emitter thereof. The output of the second pre-amplifier stage is taken from the collector of transistor 11 and is applied through capacitor 18 to the base of the driver transistor 12.

The output of the driver transistor 12 is applied to the primary of a push-pull input transformer 19, the ends of the secondary winding being connected to the respective bases of transistors 13 and 14. The center tap of the secondary of transformer 19 is connected through series resistors 20 and 21 of the emitters of the transistors. The output of the push-pull transistors is applied to a load which, by way of example, is shown as the series-connected windings 22*a* and 22*b* of a servo motor 22, the junction of the windings being connected to the center tap of the secondary.

The amplifier is energized from a suitable D.-C. voltage source 23, such as a 28 volt battery, the negative terminal being grounded and the positive terminal going to the collector-base circuits of the transistors in the several stages. Positive potential is applied to the collector of transistor 10 through resistor 25, to the collector of transistor 11 through resistor 26, to the collector of transistor 12 through the primary of transformer 19 and to the collectors of transistors 13 and 14 through the respective windings 22*a* and 22*b* of servo motor 22.

In operation, a signal applied to input terminal 15 will be amplified in the various stages of the amplifier to generate an energizing current in the servo motor whose amplitude and phase will determine the direction and extent of movement of the servo motor. The input signal, in the context of the altimeter mentioned previously, acts as an error signal to cause the servo motor to move a control element to a null position, at which point the signal is reduced to zero.

Since in practice the input signal is of low level and must precisely control a servo system under circumstances where space is at a premium and reliability is vitally important, it is essential that the amplifier be highly efficient and stable. Accordingly, each stage of the circuit is designed for minimum variation of gain and collector current and overall negative A.C. feedback is used for A.C. gain stability.

Maximum D.C. and A.C. stability are achieved by utilizing D.C. and A.C. feedback in each individual stage. The output of the first pre-amplifier stage is developed across resistor 25 in the collector circuit and a portion thereof is fed back negatively through resistor 27 to the base circuit. Similarly, in the second stage, a portion of the output voltage developed across resistor 26 is fed back degeneratively through resistor 28.

Resistors 25 and 26 are load resistors ($R_L$) and resistors 27 and 28 are base circuit feedback elements ($R_B$). The combination of $R_B$ and $R_L$ provides both A.C. and D.C. feedback, only two components being used in each pre-amplifier stage.

It can be shown that:

$$\frac{\Delta I_c}{\Delta I_{co}}=\frac{1}{\left[1-\alpha\left(\frac{1-R_L}{R_B}\right)\right]} \quad (1)$$

wherein:

$I_c$=collector current
$I_{co}$=temperature-sensitive current
$\alpha$=common base current gain of transistor Director-current stabilization of the output stage is accomplished by the emitter and base resistors 20 and 21, resistor 21 being connected between the emitters of transistors 13 and 14 and ground, and resistor 20 between the bases and ground through the respective halves of the secondary of transformer 19. The base resistance is equal to ½ the equivalent series resistor of the driver transformer secondary and the resistance of the resistor 20.

It can be shown that the stability equation of this configuration is equal to:

$$\frac{\Delta I_c}{\Delta I_{co}}=\frac{1+R_1/R_2}{1-\alpha+R_1/R_2} \quad (2)$$

wherein:

$R_1$=the ohmic value of resistor 21

$R_2$=the ohmic value of resistor 20+½ secondary when $$R_B = R_2 + \frac{R}{2}$$

transformer and $I_c$, $I_{co}$ represents the same quantities as in Equation 1.

Overall A.-C. gain stability is realized by utilizing a feedback network between the output of the final stage and the input of the first stage. To this end, the output voltage is developed across the resistors 29 and 30 connected in series between the collector of transistor 14 and ground, a portion of the voltage developed thereacross being fed to the input of the first stage through resistor 31 connected between the junction of the series resistors 29 and 30 and the base circuit of transistor 10. Resistors 29, 30 and 31 are preferably of precision type. It has been found that a $\beta$K product 10 stabilizes the amplifier gain to within ±3 db in the temperature range of operation.

It will be seen from the foregoing that the amplifier involves the minimum number of components to obtain high efficiency and stability. Thus it lends itself to miniaturization. In one practical embodiment of the invention, the circuit parameters are as given in the drawing. Maximum power and weight per unit volume is obtained (2.1 watts per cubic inch; 1.5 watts per ounce)—high input impedance (50 kilo ohms)—high voltage gain (60 db) and high power gain (85 db).

It will be noted that the high input impedance at the input terminals 15 is determined essentially by the 50,000 ohm resistor interposed between the input terminals and the base of the pre-amplifier transistor 10. The shunt negative feedback paths in the pre-amplifier circuit act effectively to decrease the input impedance thereto to a very low value approaching zero. However, the input impedance of the transistor is in series with the resistor, hence variations in this input impedance have a negligible effect on the input impedance as seen at the input terminals 15.

While there has been shown what is considered to be a preferred embodiment of the invention, it will be maniest that many changes and modifications may be made therein without departing from the essential spirit of the invention. It is intended, therefore, in the annexed claims to cover all such changes and modifications as fall within the true scope of the invention.

What is claimed is:

1. A multiple-stage transistorized amplifier comprising at least one pre-amplifier stage each having a single transistor, means to apply an input signal to said first pre-amplifier stage through a relatively high fixed impedance, a driver stage coupled to said pre-amplifier stage and including a single transistor and gain control means therefor, and a final stage coupled to said driver stage and including a pair of transistors in push-pull relation, a direct negative feedback path in said pre-amplifier stage to stabilize same for both alternating and direct current signals, a direct negative feedback path in said output stage to stabilize same for direct-current, and a negative feedback network between said output stage and said input stage to provide overall alternating current gain stability.

2. A multiple-stage transistorized amplifier comprising first and second pre-amplifier stages each including a transistor, means to apply an input signal to said first pre-amplifier stage through a relatively high fixed impedance, a driver stage coupled to the output of said second pre-amplifier stage, and a final stage coupled to said driver stage and including a pair of transistors in push-pull relation, a direct negative feedback path in each of said pre-amplifier stages to stabilize same for both alternating and direct current signals, a direct negative feedback path in said output stage to stabilize same for direct-current, and a negative feedback network between said final stage and said first stage to provide overall alternating current gain stability, said network including a load resistor connected to one of the transistors in said final stage, and a feedback resistor connected capacitively between a point in said load resistor and the base circuit of said first stage.

3. A multiple-stage transistorized amplifier comprising first and second pre-amplifier stages each including a transistor, means to apply an input signal to said first pre-amplifier stage through a relatively high fixed impedance, a driver stage coupled to the output of said second pre-amplifier stage, and a final stage coupled to said driver stage and including a pair of transistors connected in push-pull relation, a direct negative feedback path in each of said pre-amplifier stages to stabilize same for both alternating and direct current signals, said path including a resistor connected between the collector and base of the transistors in each pre-amplifier stage, a direct negative feedback path in said final stage to stabilize same for direct-current, and a negative feedback network between said output stage and said input stage to provide overall alternating current gain stability, said network including a load resistor connected to one transistor in said final stage and a feedback resistor connected capacitively between a point in said load resistor and the base circuit of said first pre-amplifier.

References Cited in the file of this patent

UNITED STATES PATENTS

| | | |
|---|---|---|
| 2,762,873 | Goodrich | Sept. 11, 1956 |
| 2,784,262 | Crow | Mar. 5, 1957 |
| 2,852,625 | Nuut | Sept. 16, 1958 |
| 2,951,991 | Rickner | Sept. 6, 1960 |
| 2,989,628 | Horgan | June 20, 1961 |
| 3,008,092 | Cawthara | Nov. 7, 1961 |

FOREIGN PATENTS

| | | |
|---|---|---|
| 757,214 | Great Britain | Sept. 19, 1956 |

OTHER REFERENCES

Herscher: "Designing Transistor A-F Power Amplifiers," Electronics Engineering Edition, April 11, 1958, pages 96–99.

Dion: "Common Emitter Transistor Amplifiers," Proc. IRE, May 1958, page 920.

Aronson: Transformerless Transistorized A-F Power Amplifier Has 7–W Output," Instruments and Automation, August 1958, page 1371.

Hinrichs et al.: " 'Squarved' Input Stages for Low-Level Transistor Amplifiers," 1958, IRE Wescon Convention Record, vol. 2, part 2, pages 104–114 (page 111 only relied on).